US012800618B2

(12) United States Patent
Zbinden

(10) Patent No.: US 12,800,618 B2
(45) Date of Patent: Nov. 17, 2026

(54) ALL FIBER ELECTRO-OPTICAL VOLTAGE SENSOR FOR ELECTRICAL SWITCHGEAR

(71) Applicant: Adam Jon Zbinden, Kenmore, WA (US)

(72) Inventor: Adam Jon Zbinden, Kenmore, WA (US)

( * ) Notice: Subject to any disclaimer, the term of this patent is extended or adjusted under 35 U.S.C. 154(b) by 114 days.

(21) Appl. No.: 19/054,849

(22) Filed: Feb. 16, 2025

(65) Prior Publication Data

US 2025/0189564 A1 Jun. 12, 2025

(51) Int. Cl.
*G01R 15/24* (2006.01)
*G01R 1/07* (2006.01)
*G01R 31/327* (2006.01)

(52) U.S. Cl.
CPC ........... *G01R 15/243* (2013.01); *G01R 1/071* (2013.01); *G01R 15/247* (2013.01); *G01R 31/3274* (2013.01)

(58) Field of Classification Search
CPC .... G01R 15/243; G01R 1/071; G01R 15/247; G01R 31/3274
See application file for complete search history.

(56) References Cited

U.S. PATENT DOCUMENTS 5,113,131 A * 5/1992 Cooper ................ G01R 15/241 324/96
5,171,981 A * 12/1992 Wood ...................... G01R 1/071 324/96
2008/0303510 A1 * 12/2008 Blake ................... G01R 15/142 324/96

FOREIGN PATENT DOCUMENTS

WO WO-2012163923 A1 * 12/2012 ........... G01R 15/242

* cited by examiner

*Primary Examiner* — Christopher E Mahoney

(57) ABSTRACT

An all fiber optic electric field sensor for indoor switchgear phase conductor bus bar voltage sensing, which is galvanically isolated from the electric circuit of the switchgear power distribution system, featuring a single mode optical transmitter, installed on the front side of a switchgear cubicle, which connects via an optical patch cord routed in conduit to a passive, in-line, all fiber polarization filtering module installed on the back of the switchgear cubicle, which connects to an all dielectric single mode fiber optic voltage sensor cable with standardized Kerr constant, routed within insulating all dielectric rigid conduit, which is secured with mechanical support brackets, featuring integrated vibration dampers, which traverses an optical path in parallel with a phase conductor bus bar and a ground bus, and where the degree of electric field induced birefringence occurring on the optical path which is perpendicular to the electric field radiating from the phase conductor is measured by observing the phase shift occurring in the orthogonally polarized modes during traversal of the single mode electro-optical voltage sensor cable perpendicular to the electric field, where an output of the sensor cable is analyzed with a 1×2 polarization maintaining fiber coupler which divides the polarized optical signal power equally to measure the preponderance of right circular polarized light over left circular polarized light, with the difference in optical intensity observed at the photodiodes proportional to the phase shift which varies exponentially with the electric field potential as an inverse function of linear distance from the phase conductor.

1 Claim, 3 Drawing Sheets

ALL FIBER ELECTRO-OPTICAL VOLTAGE SENSOR FOR ELECTRICAL SWITCHGEAR

BACKGROUND OF THE INVENTION

Voltage sensing in low and medium voltage switchgear is required for power system protection and control. The voltage is specified on a per unit basis which defines the normal electrical system operating parameters. ANSI elements 27 and 59 monitor under and over voltage conditions which, when asserted, trip protective circuit controls into an open state, for protection and control of the electrical power system.

Voltage sensors in 480V power distribution switchgear are comprised of #12 SIS wires tapped directly to the copper bus bars, with wire leads brought out directly to electromagnetic transformers which step down the voltage to a level which can be digitally sampled as an input to digital microprocessor relays. At medium voltage, such as 12.5 KV, the voltage sensing requires draw-out potential transformers which connect to the copper bus bars on the primary H1/H2 side of the potential transformer, and where the stepped down voltage on the secondary X1/X2 terminals of the potential transformer (PT) are tapped with #12 SIS wire and stepped down to digital logic voltage levels which can be sampled with an analog to digital (A/D) conversion card as an input to the backplane of a digital microprocessor relay.

In the former case of #12 SIS wire tapped directly to 480V bus, these leads may be wired directly into meters or relays, where the step-down voltage transformation to analog voltage levels for digital sampling occurs, without intermediate fusing or circuit breakers, such that the leads always remain energized, which poses a safety issue for maintenance or troubleshooting, as the sensor wires remain hot when disconnected as long as the bus is live. In many instances it is required to troubleshoot SCADA circuits without taking an outage, and this presents a problem if the voltage sensing leads require testing or reconfiguration as they are unable to be de-energized independently of the main bus where the sensing leads are connected.

In the case of draw out potential transformers in medium voltage switchgear, the instruments are heavy, mechanically prone to jamming, and occupy valuable space in the switchgear cubicle layout which could be used by additional feeders or instrumentation if alternative voltage sensing means with reduced form factor were available.

It is therefore desirable to provide a means of observing voltage, in the form of electric field potential, which does not require analog induction transformers, and which is galvanically isolated such that testing or troubleshooting the voltage sensing circuit does not risk electrical energy exposure from the main bus. The present invention teaches an optical voltage sensor for indoor low and medium voltage switchgear which is galvanically isolated from the electrical power distribution system, and which does not require the large iron cores and copper windings of potential transformer (PT) drawers.

The Kerr effect describes the polarization dependent phase shift exerted on orthogonally polarized modes traversing a perpendicular path relative to an electric field. The S and P orthogonally polarized modes experience different indices of refraction which produces linear birefringence which varies exponentially based on the electric field potential as an inverse function of linear distance from the electric field source comprised of the bus bar conductor, as modulated by the Kerr constant which describes the magnitude of electric field induced birefringence, which for fused silica glass, such as standard SM telecom fiber, is 0.053 ($10^{-14}$ m $V^{-2}$) at a wavelength of 633 nm.

$$\Delta n = n_P - n_S = \bar{n} K_E^2 \qquad \text{Eq. 1}$$

Where the birefringence induced by an electric field E is described as Δn, the difference between the observed refractive indices of the parallel and perpendicular polarized modes when traversing a perpendicular path to an electric field, E, and where the Kerr constant, K, correlates the degree of birefringence observed, based on the average of the S and P refractive indices, inversely proportional to the measurement distance from the square of the electric field potential, E.

The present invention measures the phase shift experienced by two orthogonally S and P polarized modes of equal amplitude, after traversing a perpendicular path to the electric field radiating from a phase conductor bus bar.

In the present invention, an optical pulse linearly polarized at 45° is transmitted along an all dielectric fiber optic cable, routed within rigid insulating dielectric conduit, in parallel with a bus bar phase conductor, and in parallel with respect to the ground bus and switchgear ground potential, and where the phase shift resulting from the birefringence induced by the perpendicularly oriented electric field radiating from the phase conductor is analyzed at a receiver by splitting the polarized optical pulse equally and filtering through circular polarizers which measure the amounts of right and left circularly polarized light, and where the difference in the intensity measurements transduces the degree of phase shift experienced by the linearly polarized, in phase, equal amplitude orthogonal modes which traverse a perpendicular path through the electric field, E.

For linearly polarized light, the Stokes parameter S3, which describes the preponderance of right circularly polarized light over left circularly polarized light, is null, as the phase angle δ between the modes, which describes the phase shift, is initially zero, for light which is linearly polarized at 45°, and only after a phase shift & occurs and the linear polarization becomes elliptical does S3 become observable:

$$S_3 = 2_{E_{0x}E_{0y}} \sin\delta \qquad \text{Eq. 2}$$

From Equation 2, observations of S3 directly measure the phase delay, δ, between the orthogonally polarized modes, which is directly proportional to the electric field induced birefringence, and when modulated by the Kerr constant K, the observed intensity difference varies exponentially with the electric field potential, E, according to Equation 1 as an inverse function of observation distance from the electric field source.

SUMMARY OF THE INVENTION

An optical transmitter module, comprised of a single mode laser transmitter connected to a DC power supply, is mounted on the front side of the interior of a switchgear cabinet, and transmits via single mode fiber optic patch cord to a linearly polarizing fiber optic module mounted and installed proximate the phase conductor bus bar, on a back side of the switchgear cubicle where voltage is being measured, and the output of the linear polarizer fiber-optic module connects to an all dielectric single mode fiber optic sensor cable, housed within rigid insulating dielectric conduit, which is mounted parallel to the bus bar with an insulating bracket with integrated vibration dampers, and the dielectric single mode fiber optic sensor cable traverses a perpendicular path relative to the electric field radiating from the phase conductor bus bar, with respect to the ground potential established by the ground bus within the switchgear cubicle which connects to the switchgear ground grid network, and the phase-shifted orthogonally polarized modes which are outputs of the fiber optic voltage sensor cable routed within rigid conduit in parallel with the bus bar conductor connects with a polarization analyzer module, which splits the signal via a 1×2 polarization maintaining fused fiber coupler, or a PLC silicon splitter chip as used in passive optical networks (PON), with each half of the divided signal routed to polarizing filters with output intensities dependent on the amount of right and left circularly polarized light generated by the phase shift, and where the difference in the output intensities is a direct measurement of the Stokes parameter S3, from which the phase delay δ and electric field induced birefringence is directly calculated with Equation 2, which varies exponentially with the electric field potential, as an inverse function of electro-optical interaction distance from the electric field source, as modulated by the Kerr constant for the waveguide material of the single mode fiber optic cable sensor, based on Equation 1.

DETAILED DESCRIPTION OF THE INVENTION

It will be obvious to one skilled in the art field of the present invention that the optical transmitter comprised of a single mode laser and photo-detector modules may be integrated directly proximate to a SCADA I/O concentrator back-plane, while the polarizing filter which generates the linearly polarized 45° reference input, and the 1×2 polarization maintaining optical splitting and phase shift measuring polarization analyzer modules, may be installed directly proximate the input and output of the fiber optic cable sensor which traverses a parallel path relative to the phase conductor bus bar and ground bus bar, perpendicular to the electric field with respect to ground potential, where the input and output transitions are demarcated by the dielectrically insulating and vibration dampening mechanical support brackets which secure the Kerr-effect sensing fiber optic cable and conduit perpendicular to the electric field radiating from the phase conductor bus bar, with respect to ground potential.

The fiber optic cable sensor will be jacketed and insulated mechanically to dampen any potential for vibration within the outer rigid conduit, while the mechanically insulating brackets incorporate damping to eliminate the transfer of any acoustic vibration from the environment to the cable sensor during normal operation, such that the linear birefringence of the Kerr effect fiber optic cable sensor is insulated from acoustic disturbances and therefor only transduces the birefringence induced by the electric field and which is described by Equation 1.

In the event of abnormal seismic events, such as would occur during an earthquake, or any other environmental event producing acoustic waves of magnitude which would render the sensor blind due to the overwhelming acoustic noise observed at the analyzer, the abnormal birefringence signal which is generated by such a seismic event shall be programmed to automatically trip all protective circuit devices via the connected SCADA controls, as though a fault had occurred, since in the case of environmental catastrophes such as earthquakes, where structures may be expected to fail, the de-energization of circuits is a necessary safety measure to prevent unintended incident energy exposure and electrocution hazards.

Figure 1:
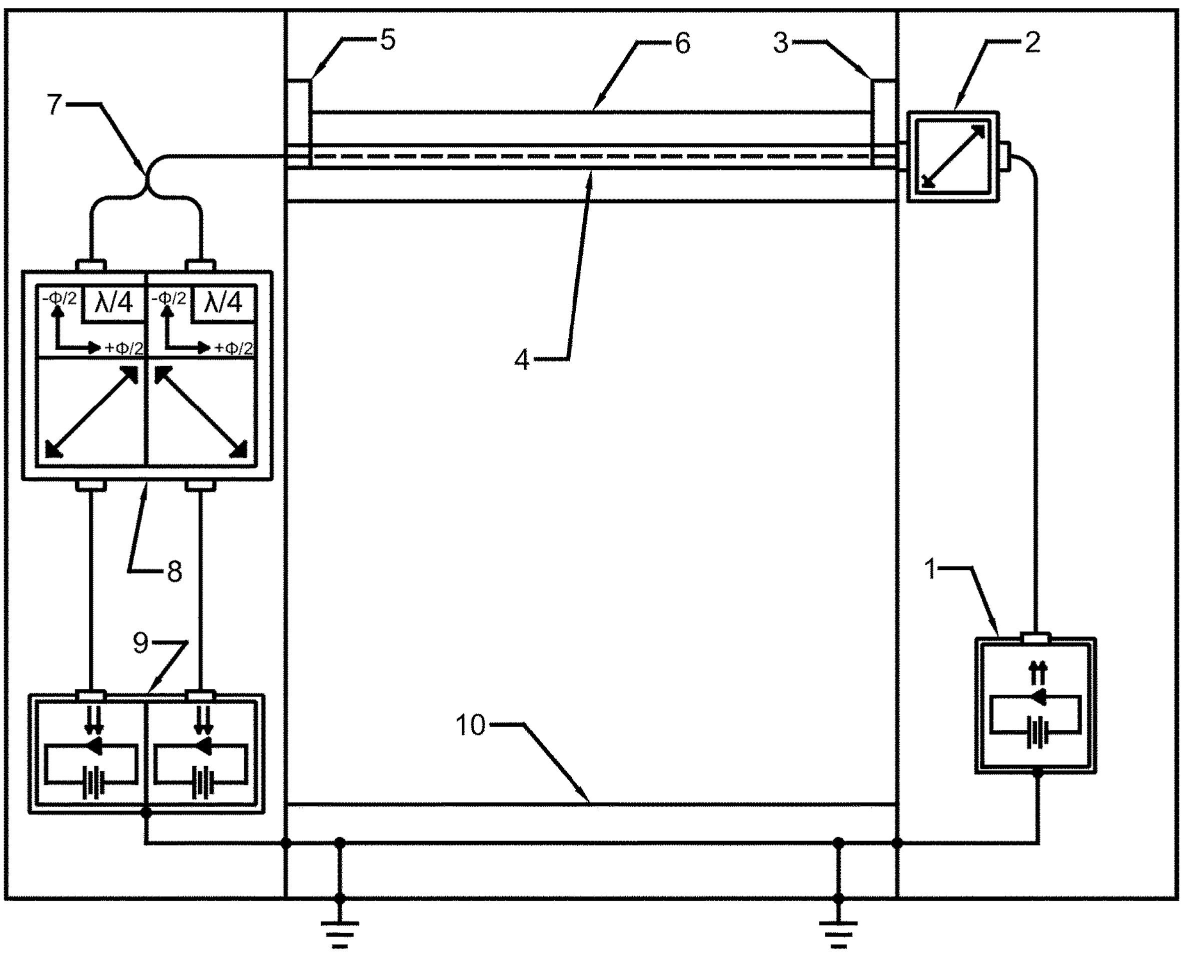
FIG. 1 depicts a schematic layout of the present invention within a typical switchgear cubicle section where voltage is being observed on a bus bar conductor 6, where 1 is an optical transmitter module, comprised of a single mode distributed feedback laser diode, which connects via single mode fiber optic patch cord routed within the switch gear to a fiber optic linear polarizer reference signal generator 2 which is installed within the switchgear cubicle proximate to the phase conductor bus bar 6, where a linear 45° degree polarized light output from 2 is an input to 4, an all fiber electro-optical single mode cable sensor with a standardized Kerr constant routed within a rigid insulating conduit, which is secured in parallel relative to a phase conductor bus bar conductor 6 with an insulating dielectric bracket 3 which mechanically secures the fiber optic sensor cable and conduit 4 which is routed in parallel with respect to the electrical conductor bus bar 6 and the ground bus 10, such that the equal amplitude, linearly polarized and in-phase S (perpendicular) and P (parallel) modes transmitted from 2 traverse a perpendicular path relative to the electric field radiating from the phase conductor bus bar 6 with respect to ground potential at 10, and where another insulating dielectric bracket 5 transitions the fiber optic cable sensor and conduit from the region where the electric field is being sensed back to a polarization reference signal analyzer mounted on an opposite section of the switchgear cubicle interior, where the analyzer is comprised of a 1×2 polarization maintaining splitter 7, which transmits to a polarizing filter module 8, comprised of quarter wave plates followed by +45° and −45° linear polarizers, respectively, which reject right and left circularly polarized light to transduce their respective intensity magnitudes, as the output intensity of 8 will vary in direct proportion to the amount of right and left circularly polarized light present in the polarized optical pulses divided at 7, and the photo diodes which are integrated with the photo-detector modules 9 produce an output current proportional to the optical intensity generated by the polarization analyzing filters 8 which is converted to a transimpedance analog voltage output by the photo-detector modules 9.

As the polarization filtering occurs proximate the fiber optic cable sensor where the electro-optical phase shifting Kerr effect is observed in the presence of the electric field radiating from energized bus bar within the switch gear, the use of polarization maintaining fiber is not required, and non-PM single mode fiber may be used for all patch cord links between modules as shown in FIG. 1. The patch cords shall be routed in conduit or micro duct such that the fiber optic cables are insulated from vibration and are all dielectric to be electrically non-conductive with respect to proximate electric fields.

The fiber optic cable sensor waveguide material may be fused silica, flint glass, or alternatively doped to manipulate the Kerr constant, however the present invention claims all such embodiments including standard fused silica glass with Kerr constant of 0.053 ($10^{-14}$ $mV^{-2}$).

FIG. 1 is not drawn to scale and is enlarged to show the optical polarization schematic. In the preferred embodiment, the polarization generator module is comprised of an in-line all fiber linear polarizer with a high extinction ratio, and the polarization analyzer is comprised of a polarization maintaining 1×2 fiber coupler and additional in-line fiber polarizers, and where the quarter-wave plate retarding polarizing element is produced by coiling a section of single mode fiber around a mandrel structure with a bending radius tuned to produce a refractive index difference for S and P orthogonal modes yielding quarter wave phase retardance prior to the linear polarizer splice point in the analyzer circuit.

Figure 2:
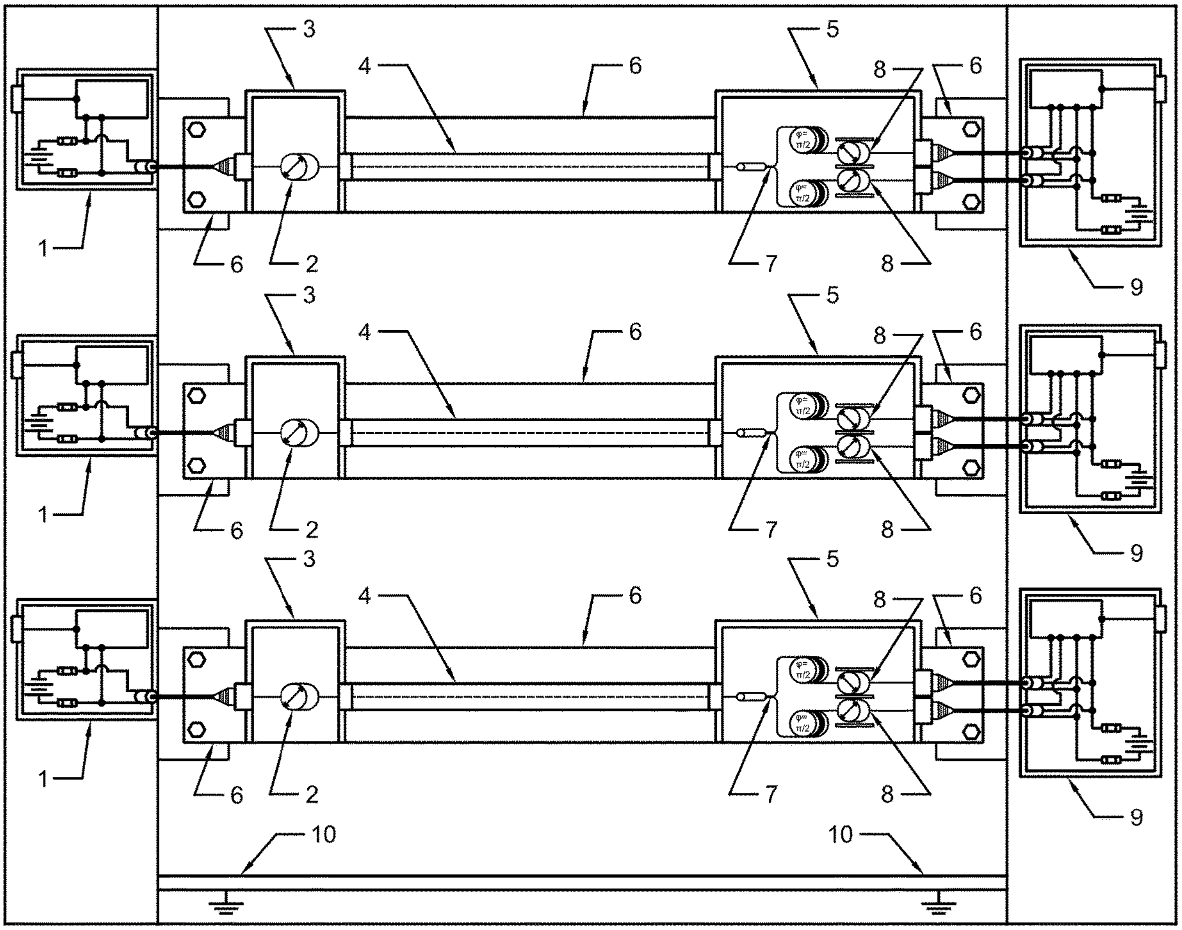
FIG. 2 depicts a modular view of the preferred embodiment of the present invention, where the fiber optic polarization reference signal generator 2 is integrated with the first dielectric insulating bracket 3 and the polarization reference signal analyzer comprised of 7 and 8 is integrated with the second dielectric insulating bracket 5 while the photo-detector module 9 contains photo-detectors with integrated transimpedance analog voltage outputs which are connected to analog-to-digital conversion inputs integrated with digital signal processing chipsets which sample the analog voltage outputs of the photo-detectors for digital SCADA network integration via auxiliary communication ports.
Figure 3:
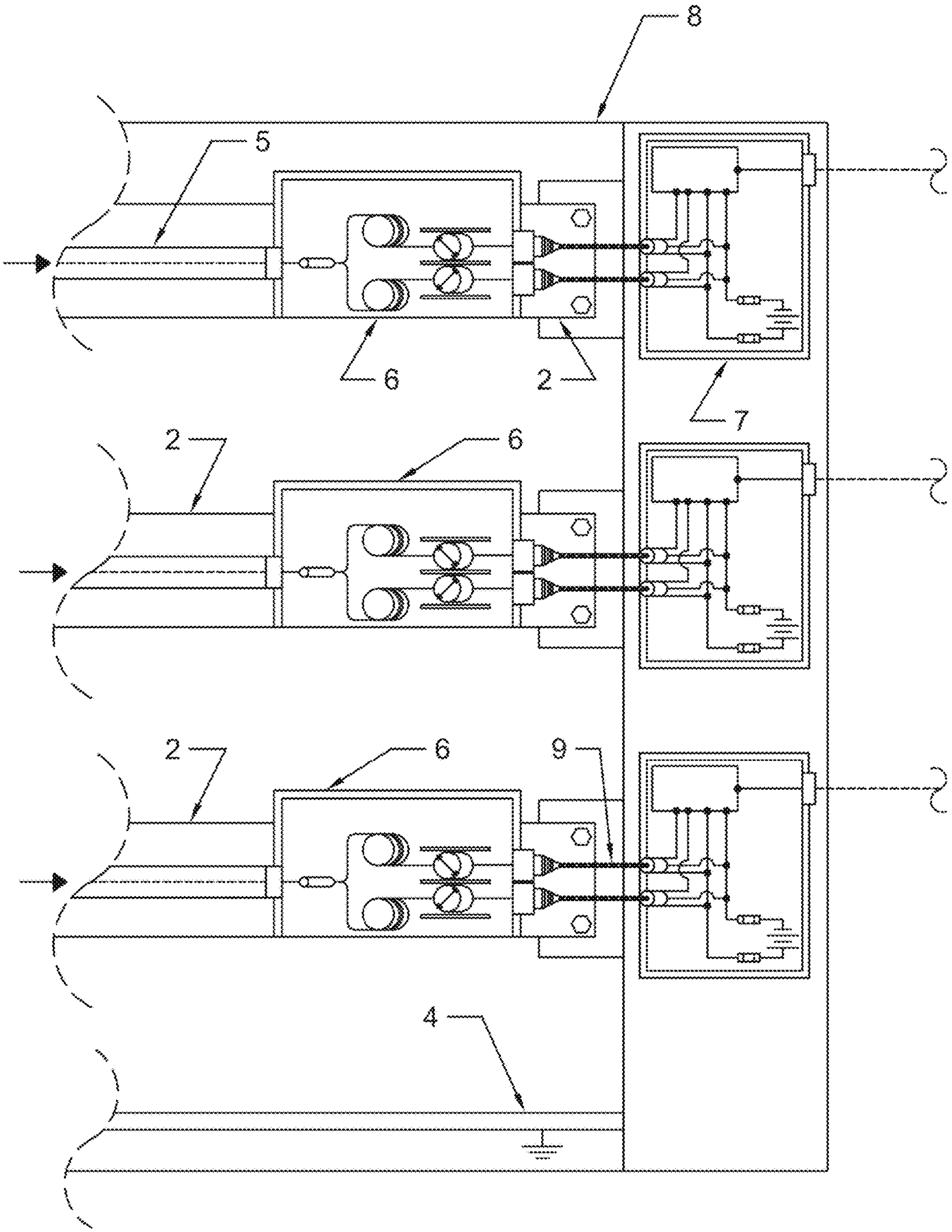

The passive optical filtering modules comprised of fiber optic polarization generator 2 and fiber optic polarization analyzer 7,8 which are connected to the input and output of the Kerr effect sensing single-mode fiber optic cable, which is mounted in parallel with respect to the phase conductor bus bar and ground bus bar, may be mounted on the back side of the switch gear cubicle panel and integrated with the insulating brackets 3 and 5 respectively as shown in FIG. 2, with direct outputs connecting via the insulating mounting brackets which position the fiber optic cable sensor and conduit relative to the bus bar, while the single mode distributed feedback laser transmitter and associated power supply, and the photodetector module where optical intensity measurements proportional to the electric field induced birefringence are measured, may be mounted and installed on the front side of the switch gear cubicle section where the bus voltage is being optically measured, in a preferred installation embodiment.

With no voltage applied to the phase conductor bus bar, with respect to the ground bus potential, some characteristic amount of linear birefringence will exist in the single mode fiber optic Kerr-effect electric field sensing circuit, and this will be observed at a zero-energy condition for calibration. For alternating current measurements, this zero-voltage linear birefringence characteristic magnitude for the optical voltage sensing network will re-occur at every zero-crossing, with the observed phase delay resulting from linear birefringence induced by the electric field increasing and decreasing concomitantly with the rise and fall of the sinusoidal voltage waveform, and as the polarized optical pulses are modulated with a much higher frequency than the fundamental electrical power frequency based on the impulse response of the solid state photo-detectors, a hypothetical 100 nano-second impulse response from optical photo-detectors samples each voltage cycle wave form at 10,000,000 samples per 60 hertz electrical wave cycle, while standard digital signal processing chipsets are limited to 1M samples per second, which still over-samples the 60 hertz fundamental frequency of the electrical field wave form being optically measured by a factor >8,000, which guarantees accurate sampling per the factor of two sampling rate multiplier requirement relative to the fundamental frequency of the sampled signal as stipulated by the Shannon-Nyquist sampling theorem to avoid aliasing in the sampled signal.

The digital signal processing of the analog voltage outputs of the photodetectors within the photo-detector modules as shown in FIG. 2 also offers digital harmonic waveform analysis potential with the discrete Fourier transform, with a limit on harmonic order measurement determined by the over-sampling factor of the fundamental 60 hertz frequency.

The Mueller matrices provide a useful mathematical description of the filtering characteristics of the right and left circular polarizing filters used in the optical analyzer of the present invention, where the combination of a quarter wave retarding fiber coil with a linear fiber optic polarizer at a ±45° angle with respect to the fast and slow axes of the wave plate fiber optic coil creates a filter which can measure the amount of right or left circular polarized light by rejecting the transmission of RCP or LCP light based on the Mueller matrix derivations for the right and left circular polarizing filters:

For the right circular polarizing filter, the output is polarized at linear +45° while the right circular component is rejected, and the intensity of the output varies inversely with the magnitude of the RCP eigenmode as shown with Equation 3 and Equation 4:

$$M_{LP_{+45^\circ}} M_{\frac{1}{4}\lambda_{WP}} = \left(\frac{1}{2}\right)\left(\begin{pmatrix} 1 & 0 & 1 & 0 \\ 0 & 0 & 0 & 0 \\ 1 & 0 & 1 & 0 \\ 0 & 0 & 0 & 0 \end{pmatrix}\begin{pmatrix} 1 & 0 & 0 & 0 \\ 0 & 1 & 0 & 0 \\ 0 & 0 & 0 & -1 \\ 0 & 0 & 1 & 0 \end{pmatrix}\right) = \begin{pmatrix} 1 & 0 & 0 & -1 \\ 0 & 0 & 0 & 0 \\ 1 & 0 & 0 & -1 \\ 0 & 0 & 0 & 0 \end{pmatrix} \quad \text{Eq. 3}$$

$$M_{RCP} = \left(\frac{1}{2}\right)\left(\begin{pmatrix} 1 & 0 & 0 & -1 \\ 0 & 0 & 0 & 0 \\ 1 & 0 & 0 & -1 \\ 0 & 0 & 0 & 0 \end{pmatrix}\begin{pmatrix} S_0 \\ S_1 \\ S_2 \\ S_3 \end{pmatrix}\right) = \left(\frac{1}{2}\right)(S_0 - S_3)\begin{pmatrix} 1 \\ 0 \\ 1 \\ 0 \end{pmatrix} \quad \text{Eq. 4}$$

For the left circular polarizing filter, the output is polarized at linear −45° while the left circular component is rejected, and the intensity of the output varies inversely with the magnitude of the LCP eigenmode as shown with Equation 5 and Equation 6:

$$M_{LP_{-45^\circ}} M_{\frac{1}{4}\lambda_{WP}} = \left(\frac{1}{2}\right)\left(\begin{pmatrix} 1 & 0 & -1 & 0 \\ 0 & 0 & 0 & 0 \\ -1 & 0 & 1 & 0 \\ 0 & 0 & 0 & 0 \end{pmatrix}\begin{pmatrix} 1 & 0 & 0 & 0 \\ 0 & 1 & 0 & 0 \\ 0 & 0 & 0 & -1 \\ 0 & 0 & 1 & 0 \end{pmatrix}\right) = \begin{pmatrix} 1 & 0 & 0 & 1 \\ 0 & 0 & 0 & 0 \\ -1 & 0 & 0 & -1 \\ 0 & 0 & 0 & 0 \end{pmatrix} \quad \text{Eq. 5}$$

$$M_{LCP} = \left(\frac{1}{2}\right)\left(\begin{pmatrix} 1 & 0 & 0 & 1 \\ 0 & 0 & 0 & 0 \\ -1 & 0 & 0 & -1 \\ 0 & 0 & 0 & 0 \end{pmatrix}\begin{pmatrix} S_0 \\ S_1 \\ S_2 \\ S_3 \end{pmatrix}\right) = \left(\frac{1}{2}\right)(S_0 + S_3)\begin{pmatrix} 1 \\ 0 \\ -1 \\ 0 \end{pmatrix} \quad \text{Eq. 6}$$

The invention claimed is:

1. A fiber optic voltage sensor configured for integration with indoor electrical power distribution switchgear, comprising:

a single mode fiber-coupled distributed feedback laser diode which emits a constant optical power intensity in a continuous wave and which is connected to a direct current power supply featuring a voltage regulator;

a bend insensitive fiber optic patch cord, with an input connected to an output of said fiber coupled laser diode, with an output connected to a polarization generator module, said polarization generator module comprised of a linear 45 degree in-line all fiber optic polarizer, with an optical output of said generator connecting to an all dielectric single mode electro-optical fiber sensor cable, where said single mode fiber optic sensor cable is routed within an all dielectric rigid insulating conduit, secured in parallel with a phase conductor bus bar with an insulated mechanical support bracket featuring an integrated vibration damper, where said insulating support bracket provides a housing for said input polarization generator module which directly connects to an input of said single mode electro-optical fiber sensor cable, and where an output of said fiber optic electric field sensor cable is secured with a second mechanical support bracket featuring vibration dampers inside a switchgear cubicle where said fiber optic electric field sensor cable is routed and where said second mechanical support bracket features a housing for a passive polarization analyzer module with an input of said polarization analyzer connected to an output of said single mode fiber optic sensor cable, said polarization analyzer module comprising a polarization maintaining 1×2 fiber optic coupler with 50:50 optical power distribution, with a first output of said 1×2 polarization maintaining fiber optic coupler connected to a right circular polarizing filter, and a second output of said 1×2 fiber coupler connected to a left circular polarizing filter; a photodetector module comprised of a first photodetector with an input connected to an output of said right circular polarizing filter and a second photodetector with an input connected to an output of said left circular polarizing filter;

a digital signal processing chipset with integrated analog to digital conversion inputs which sample an analog voltage output from a respective photodetector and which calculates a difference in magnitude between said digitally sampled analog voltage outputs from said photodetectors to measure an electric voltage potential as modulated by a standardized Kerr constant of said single mode fiber optic sensor cable; and, digital communication ports which transmit said voltage measurements to a digital microprocessor relay back plane for SCADA network integration.

* * * * *